(12) United States Patent
Robinson et al.

(10) Patent No.: US 6,488,535 B1
(45) Date of Patent: Dec. 3, 2002

(54) METER SOCKET ADAPTER WITH CONNECTIONS TO ELECTRICAL COMPONENT IN AN ENCLOSURE

(75) Inventors: Darrell Robinson, Highland, MI (US); Allen V. Pruehs, Howell, MI (US)

(73) Assignee: Ekstrom Industries, Inc., Farmington Hills, MI (US)

( * ) Notice: Subject to any disclaimer, the term of this patent is extended or adjusted under 35 U.S.C. 154(b) by 0 days.

(21) Appl. No.: 10/047,695

(22) Filed: Jan. 15, 2002

Related U.S. Application Data

(63) Continuation-in-part of application No. 09/544,995, filed on Apr. 6, 2000.

(51) Int. Cl.[7] .............................................. H01R 33/945
(52) U.S. Cl. ...................... 439/517; 439/508; 439/638; 439/719
(58) Field of Search ................................ 439/517, 638, 439/639, 640, 508, 719, 135, 465, 464, 709, 718

(56) References Cited

U.S. PATENT DOCUMENTS 5,207,595 A    5/1993   Learmont et al.
D349,689 S     8/1994   Robinson et al.
5,571,031 A    11/1996  Robinson et al.
5,577,933 A    11/1996  Robinson et al.
5,586,913 A    12/1996  Robinson et al.
5,595,506 A    1/1997   Robinson et al.
5,704,804 A    1/1998   Robinson et al.
5,762,522 A    6/1998   Robinson et al.
5,853,300 A    12/1998  Robinson et al.

*Primary Examiner*—Tho D. Ta
*Assistant Examiner*—Truc Nguyen
(74) *Attorney, Agent, or Firm*—Young & Basile, PC

(57) ABSTRACT

A meter socket mountable in an enclosure and receiving blade terminals of a watthour meter in electrical contact with jaws mounted in the meter socket has an open end with wire guides to allow electrical conductors connected at one end to each of the jaws in the meter socket to exit the housing of the meter socket for connection to a remotely located meter test switch. Each of the conductors may be uniquely color coded for easy connection to the appropriate meter test switch terminal. In one aspect, the meter socket includes front and rear plates which define an internal cavity for receiving the jaw contacts and the conductors. In this aspect, the wire guides are formed on one end of one of the plates for receiving an intermediate portion of at least one conductor therethrough.

11 Claims, 12 Drawing Sheets

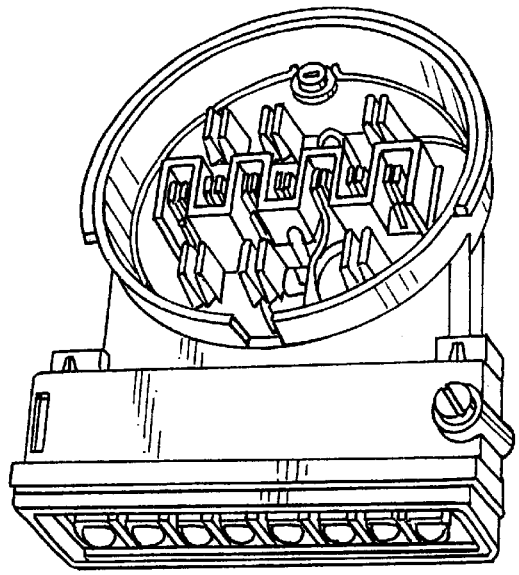
FIG. 2
PRIOR ART
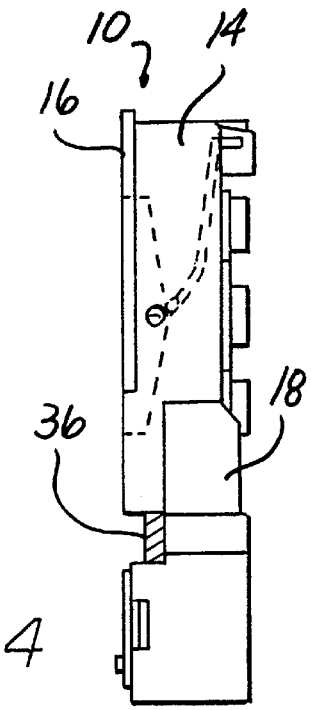
FIG. 4
| SHELL POS# | WIRE COLOR | GA. | GROUP |
|---|---|---|---|
| 1 | RED | 12 | A |
| 2 | BLACK | 12 | A |
| 3 | GREEN | 12 | B |
| 4 | ORANGE | 12 | B |
| 9 | WHITE | 12 | A |
| 10 | BLUE | 12 | A |
| 11 | RED/BLACK TRACE | 12 | A |
| 12 | WHITE/BLACK TRACE | 12 | A |
| 13 | GREEN/BLACK TRACE | 12 | A |
| 14 | RED | 16 | A |
| 15 | YELLOW | 16 | B |
| 16 | BLACK | 16 | B |
| 17 | BLACK/WHITE TRACE | 12 | B |
FIG. 7

METER SOCKET ADAPTER WITH CONNECTIONS TO ELECTRICAL COMPONENT IN AN ENCLOSURE

CROSS-REFERENCE TO CO-PENDING APPLICATION

This application is a Continuation-In-Part application of co-pending application Ser. No. 09/544,995, filed Apr. 6, 2000, the entire contents of which are incorporated herein in its entirety.

BACKGROUND

The present invention relates, in general, to watthour meters and, more specifically, to watthour meter sockets mounted in enclosures.

Power disconnect switches are used in a number of applications, such as utility watthour meter, relay, instrument transducer and control system calibration, disconnecting, troubleshooting and testing.

In the electric utility application, watthour meters are commonly employed to measure electrical power consumption at a residential or commercial establishment. A cabinet is typically mounted on an outside wall of the residence or building and contains a meter socket having pairs of line and load contacts which are connected to electric power line conductors extending from the utility power network and electric load conductors connected to the residential or building establishment power distribution network. The contacts in the socket receive blade terminals on a plug-in watthour meter to complete an electric circuit through the meter between the line and load terminals in the cabinet for the measurement of electrical power consumption.

Current transformer or CT rated watthour meters and socket adapters are employed in high current applications. In such an application, current transformers are coupled to the line and load conductors and have their output leads connected to terminals in a current transformer or CT rated watthour meter socket adapter. A low current rated watthour meter is then plugged into the socket adapter or socket to measure consumed at the building site.

In addition, potential coils in a watthour meter may also be connected by potential blade terminals to potential blade contacts mounted in the socket or socket adapter and connected by individual conductors to terminals mounted in the terminal portion of the socket adapter.

However, with current transformer rated socket adapters or sockets, it is necessary to short circuit the line and load terminals when the watthour meter is removed from the socket for replacement or testing. Heretofore, test switch devices have been incorporated into the CT rated socket to provide the necessary short circuit or bypass feature.

Exemplary test switches are made by Meter Devices Company, Inc., of Canton, Ohio. Such test switches are typically mounted in a watthour meter socket immediately below a watthour meter or watthour meter/socket adapter. The test switches are generally in the form of single throw, knife-type switches which are provided in multiples ganged together into one assembly; but each electrically connected between one line contact and one load contact in the socket. Once an optional socket cover is removed, the test switches can be operated as desired to provide the necessary bypass connection between the line and load contacts and conductors prior to removing the watthour meter from the socket for testing, recalibration, replacement, etc.

However, wiring connections are required to be made between the bottom mounted terminals on a typical watthour meter socket, such as the watthour meter socket adapter shown in U.S. Pat. No. 5,853,300, and assigned to the assignee of the present invention, and the individual terminals on the meter test switches. The two terminals between each jaw contact and each meter test switch introduce a voltage drop and a resulting power drop in the watthour meter circuitry. In addition, the extra wiring connections and conductors add cost to the watthour meter/meter test switch assembly.

The voltage drop across the terminal block connections also causes the loss of metered power. In the current circuits where a current transformer is employed, the extra terminal connections place a larger load on the current transformer which must then work harder. This effects the accuracy of the current transformer output and may require larger diameter or gauge conductors between the current transformer and the line and load terminals in the watthour meter socket.

In an attempt to address these disadvantages, Ekstrom Industries, Inc., has previously sold a pre-wired meter socket and test switch assembly including a meter socket with internal mounted meter jaws which is mounted on a planar plate. The meter test switch assembly was also mounted on the plate immediately below the jaw portion of the meter socket. Conductors from the individual jaw contacts were connected directly to the meter test switch terminals thereby eliminating at least one set of terminal blocks and the wires and associated labor required therefore.

However, this apparatus us difficult to use since the one-piece assembly is bulky and difficult to ship. Further, the utility company is required to use the meter test switch and meter socket shipped by the manufacturer. This results in duplicate parts since the utility frequently had its own supply of meter test switches or a meter test switch was already mounted in a particular socket enclosure.

Thus, it would be desirable to provide a meter socket usable with a meter test switch apparatus which overcomes the difficulties encountered with the use of previously devised meter socket and meter test switch combinations.

SUMMARY OF THE INVENTION

The present invention is a meter socket for mounting in an enclosure and connectable to a meter test switch remotely located from the meter socket.

In one aspect of the invention, the meter socket includes a housing having a base and a sidewall extending from the base. The sidewall has a generally annular mounting flange extending radially outward from one end of at least a portion of the sidewall, the mounting flange adapted for interconnection with a mating mounting flange on a watthour meter. Jaws are mounted in the base of the housing for receiving blade terminals of a watthour meter. Electrical conductors are disposed with one end in the housing connected to one of the jaws. The electrical conductors extend externally of the housing to another end adapted for connection to a remotely located meter test switch device.

In one aspect of the invention, the conductors extend from the housing in at least one and preferably two separate individually tied together groups or bundles to facilitate routing of the conductors to the meter test switch.

In another aspect, the conductors have unique exterior color coding to identify each specific conductor to facilitate connection to the appropriate meter test switch terminals.

The housing includes a filler extending between lower walls projecting from a portion of the annular sidewall of the housing. In one aspect of the invention, the filler includes a aperture which extends through the filler and an adjacent portion of the annular sidewall of the housing. This aperture facilitates the passage of electrical cable or conductors extending from a watthour meter through the socket housing when the watthour meter is mounted on the mounting flange of the housing.

In another aspect, the apparatus includes a housing having a watthour meter receiving portion and a wire guide portion spaced from the watthour meter receiving portion. A plurality of jaw-type electrical contacts are mounted in the watthour meter receiving portion, each jaw contact receiving a blade terminal of a watthour meter in a snap-in connection. Electrical conductors are connected to the jaw contacts and extend through the wire guides to external connections on an electrical component.

Means are formed on or mounted in the housing for substantially completely covering the electrical conductors and the contacts in the housing. The covering means preferably comprises the housing being formed of first and second plates, one plate having an annular side wall extending outward therefrom. The first and second plates are spaced apart, when joined together, to define an interior cavity. The electrical conductors are disposed in the cavity and are completely enclosed by the first and second plates and the annular side wall. A plurality of hollow receptacles are formed in the first plate and extend outward from the first plate. The interior of each receptacle opens to the interior cavity between the first and second plates and receives a jaw contact therein. A slot is formed in each receptacle for receiving a blade terminal of a watthour meter therethrough to enable the blade terminal to be inserted into an underlying jaw contact. Each receptacle is formed with closed side walls and an outer end wall to completely surround all portions of the jaw contact housed therein.

A plurality of potential jaw contacts are also mounted in the socket adapter housing. The potential jaw contacts are disposed in separate receptacles formed in the first plate of the housing.

Each potential jaw contact includes, by example, a base, first and second spaced, substantially co-planar, angularly bent jaws extending from the base, and a third angularly bent jaw extending from the base and disposed between the first and second jaws, an outer end of the third jaw spaced from outer ends of the first and second jaws to define a watthour meter blade terminal receiving slot between the first, second and third jaws. Means are connected to the base for connecting a first external electrical conductor to the base. Means are also carried with the base for electrically connecting one of a plurality of second external electrical conductors to each potential jaw contact.

The terminals each include a collar having a through bore and an aperture intersecting the through bore, and a terminal clip having a first and second ends, the first end disposed in the through bore in the collar. The terminal clip is formed by a first pair of tabs formed on the second end of the terminal clip, the pair of tabs defining an aperture adapted to receive one electrical conductor, and a second pair of tabs formed on the terminal clip intermediate the first and second ends of the terminal clip.

The wire guide portion includes a plurality of spaced dividers formed on the first plate.

The meter socket of the present invention provides many unique solutions to the use of previously devised meter sockets and meter test switch combinations. Providing the meter socket housing with an open end enables the conductors connected to each of the individual jaws in the socket housing to extend through the open end of the housing and routed to a connection at an opposite end to terminals on a remotely located meter test switch. This enables the meter socket of the present invention to be easily used with existing meter test switch assemblies or with any meter test switch assembly selected by a utility. The conductors extending between the meter test switch and the meter socket may be easily routed in any configuration. Arranging the conductors in at least one and preferably two tied together groups or bundles facilitates the easy routing of the electrical conductors between the meter socket and the meter test switch assembly.

An aperture may be formed in the meter socket housing and adjacent portion of the annular sidewall on the housing to facilitate the passage of data and telephone cable or other electrical conductors extending outward from a watthour meter through the socket housing without sharp bends. The enables such cable or conductors to be easily passed through the socket housing without damage and, further, easily connected to externally located devices or circuits.

Finally, the provision of unique color coded insulated jackets on each of the conductors facilitates the connection of the conductors to the appropriate terminal on the meter test switch assembly.

BRIEF DESCRIPTION OF THE DRAWINGS

The various features, advantages and other uses of the present invention will become more apparent by referring to the following detailed description and drawing in which:

FIG. 2 is a perspective view of a prior art adapter with a cable breakout notch;

FIG. 4 is a side elevational view of the meter socket shown in FIG. 3;

FIG. 7 is a chart depicting color coded conductors used in the embodiment of FIGS. 3–5;

DETAILED DESCRIPTION

Before describing the meter socket of the present invention, it will be understood that the meter socket is intended to be used with a meter test switch apparatus, such as that shown in co-pending application Ser. No. 60/146,681, filed Aug. 2, 1999, and entitled Meter Test Switch. Reference may be had to this application for a detailed explanation of the construction and operation of a typical meter test switch which may be employed with the meter socket of the present invention. The entire contents of this application are incorporated herein by reference. It will be further understood that the conductors or wires extending from the meter socket of the present invention, as described hereafter, are connectable to the various terminals on a meter test switch in a conventional manner.

Figure 1:
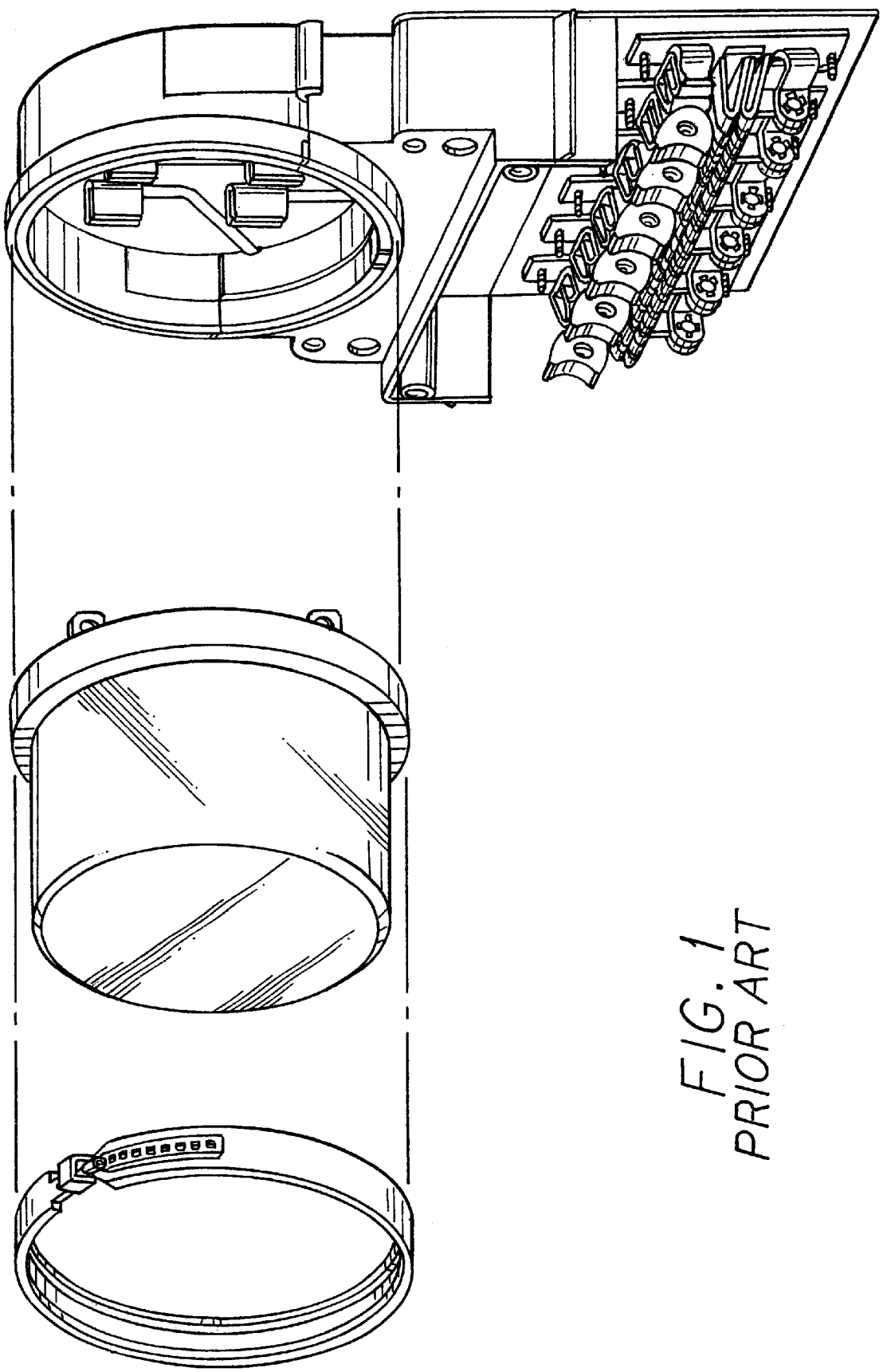
FIG. 1 is a partially exploded, perspective view of a prior art socket adapter and meter test switch assembly.
Figure 3:
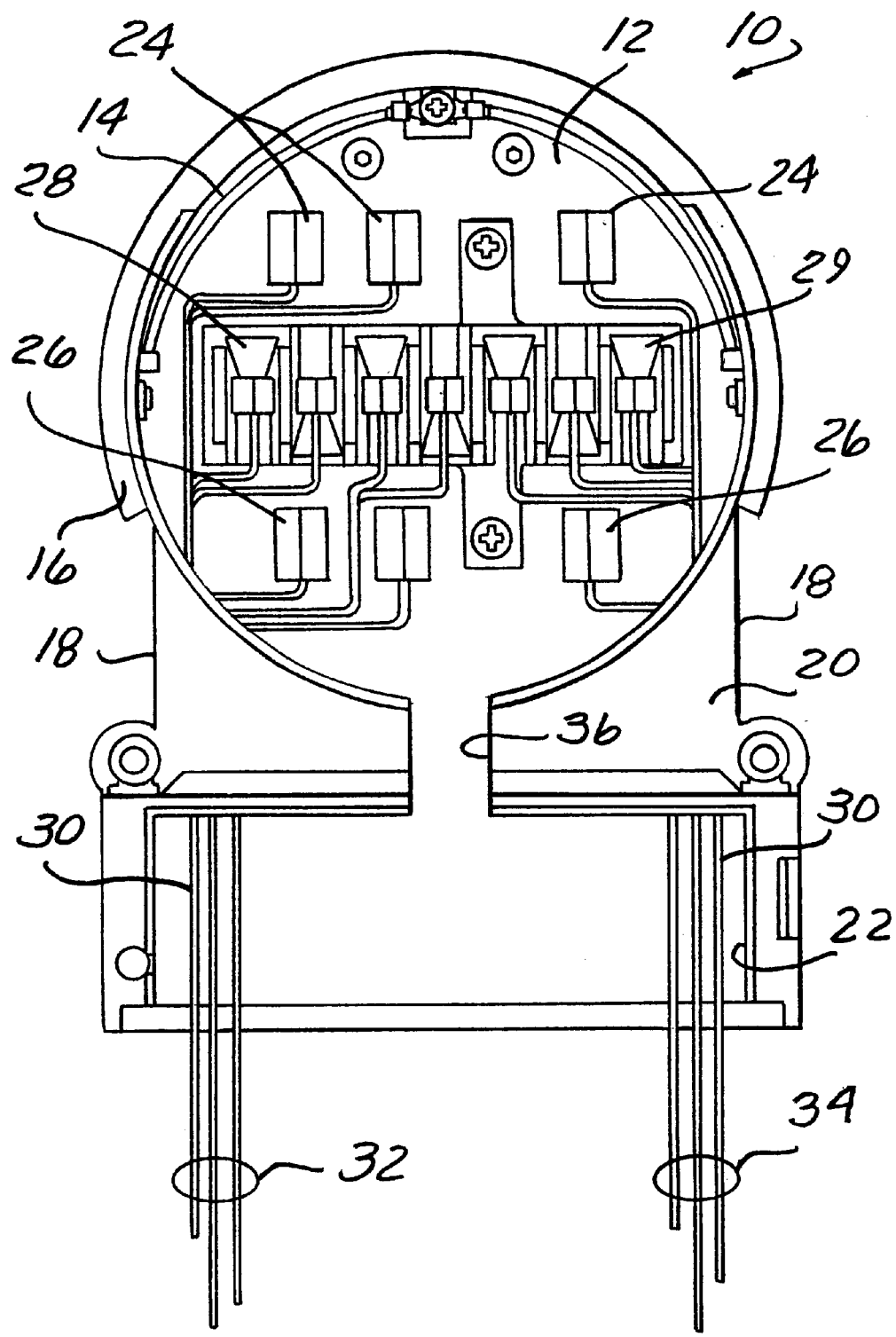
FIG. 3 is a front elevational view of a meter socket according to one aspect of the present invention.

Referring now to the drawing, and to FIGS. 3 and 4 in particular, there is depicted a meter socket or meter socket adapter 10, both hereafter referred to as a "meter socket", which is mountable in an enclosure or housing, not shown, and which is adapted for receiving blade terminals of a watthour meter, as shown in FIG. 1.

As is conventional, and explained in greater detail in U.S. Pat. No. 5,853,300, the entire contents of which are incorporated herein by reference, the meter socket 10 is formed of a suitable electrically insulating material having a base or back wall 12 and an annular sidewall 14 of generally circular configuration projecting outward therefrom. An annular mounting flange 16 projects radially outward from the outer edge of the annular sidewall 14 and serves as a mounting service for a similar mounting flange on a watthour meter.

A pair of lower walls 18 project from the annular sidewall 14 along a lower portion of the back wall 12. A filler 20 extends over the outer ends of lower walls 18 from a bottom portion of the sidewall 14. An opening 22 is formed between opposed portions of the lower walls 18. The opening 22 would normally provide access to a terminal mounting block mounted on a lower portion of the back wall 12 and serving to provide interconnection between conductors extending from various jaw contacts within the meter socket 10 and external connections, such as to a meter test switch, the utility and distribution network line and load conductors, etc. A terminal block cover, not shown, is normally mounted over the opening 22 to cover and provide authorized access to the terminals disposed within the lower walls 18 and the base wall 12.

As is further conventional, and as shown in FIG. 3, a plurality of line and load jaws or jaw contacts. FIG. 3 depicts a three phase meter socket 10 in which the three individual phase line conductors are connected to the line jaws 24 and the three single phase load conductors are connected to the load jaws 26. Also mounted on the back wall 12 are a plurality of terminals for connection to potential or current jaws 28 on a watthour meter. Due to the three phase exemplary construction of the meter socket 10, two potential jaws 28 are provided for each phase along with one ground jaw 29.

As shown in FIG. 3, individual conductors 30 are connected to each jaw 24, 26, 28 and 29 at one end and would normally, in a conventional meter socket or meter socket adapter, be connected to an individual terminal mounted in the opening 22 in the lower portion of the meter socket 10.

However, according to this invention, the individual conductors 30 are provided in a length sufficient to enable the conductors 30 to pass through the opening 22 in the lower portion of the meter socket 10 and be connected within an outer surrounding enclosure or housing to a separately located meter test switch, such as that shown in the incorporated pending application for a meter test switch. The outer ends of each conductor 30 may be provided with any type of end connection, such as eyelets, or terminals, bare ends, etc.

According to a unique aspect of the present invention, and as shown in FIG. 3, the conductors 30 are bundled into two groups 32 and 34. This bundling, which can be provided by conventional tie wraps or other bundling clips or fasteners, simplifies the routing of the conductors 30 to the remotely located meter test switch.

According to yet another aspect of the present invention, as shown in FIG. 7, the individual conductors 30 are color coded with respect to a specific jaw mounting position on the back wall 12. The reference numbers 1–17 shown in FIG. 3 in each jaw are not to be confused with the reference numbers depicting various components of the meter socket 10. Rather, the individual reference numbers 1–17 on the jaws 24, 26, 28 and 29 depict the conventional jaw mounting position in a meter socket.

By way of example, the color coding chart shown in FIG. 7 references each conductor 30 by its shell or meter socket 10 mounting jaw position. Each conductor 30 is provided with a different color insulating jacket. Conductors corresponding to jaw positions 1 and 14 and 2 and 16 have identical colors. However, the conductors 30 connected to the jaws 1 and 2 have a larger diameter cross section thereby enabling them to be distinguished from the smaller gauge size of the conductors connected to the current jaws 14 and 15. The color coding of the individual conductors 30 facilitates and simplifies the connection of the conductors 30 to the appropriate terminals in the meter test switch.

Another unique aspect of the present invention is also shown in FIG. 3 and includes an aperture 36 in the rim filler 20. The aperture 36 is shown by way of example only as being along the longitudinal center line of the meter socket 10 and extends completely through the filler 20 and the lower portion of the sidewall 14.

The aperture 36 allows any cables or conductors, such as data or telephone cables, extending out of the back of a watthour meter socket adapter to pass easily through the filler 20 in the meter socket 10 without sharp bends or elaborate routing through the lower portion of the meter socket 10. This arrangement allows such cables to lie in a natural curve or bend between the lower sidewalls 18 of the meter socket 10 and enables such conductors to pass exteriorly of the meter socket 10 for connection to the respective device or circuit.

In FIG. 4, the cross-hatched area depicts a sidewall of the filler 20 formed by removal of a portion of the filler 20 to form an aperture 36. This shape results from the conventional formation of a rib along the vertical center line of the filler 20.

Figure 5:
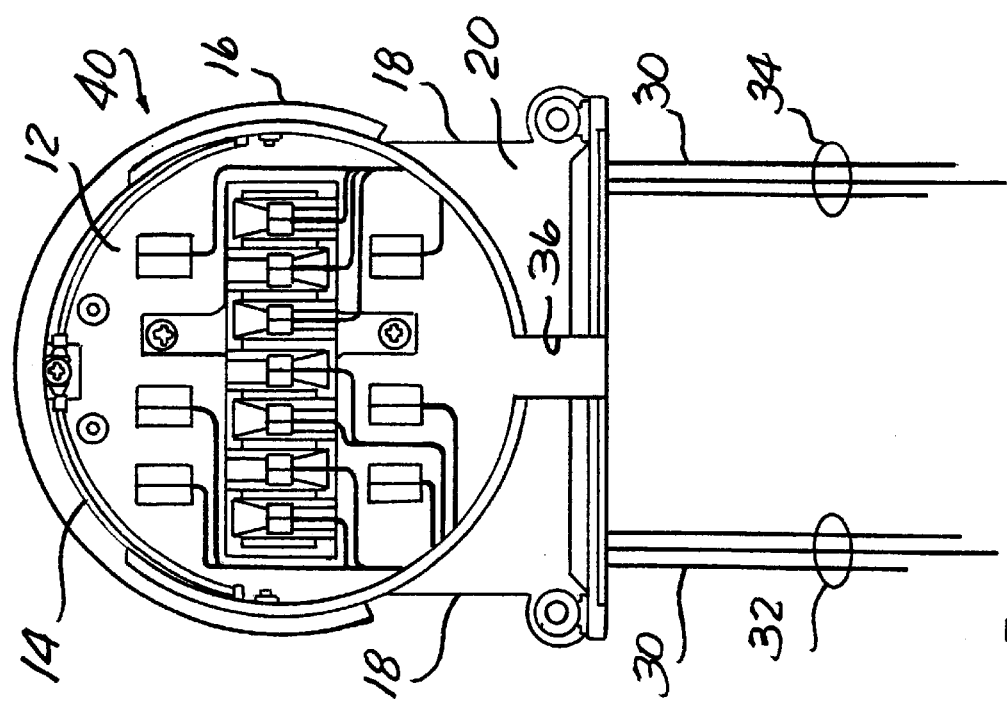
FIG. 5 is a front elevational view of another aspect of a meter socket according to the present invention.

In FIG. 5 there is depicted another aspect of the present invention wherein a meter socket 40 is constructed essentially similar to the meter socket 10, with like components being given the same reference number as like components in the meter socket 10. Thus, the meter socket 40 includes a base wall 12, an annular sidewall 14, a mounting flange 16, lower walls 18, and rim filler 20. According to this aspect to the meter socket 40, the aperture 36 is formed in the filler 20 for passage of data cables or telephone cables from a watthour meter mounted on the mounting flange 16 through the meter socket 40. The meter socket 40 also includes the same contacts and conductors 30 as in the meter socket 10. The conductors 30 are also provided in two bundles or groups 32 and 34.

The main difference between the meter socket 40 and the meter socket 10 is that the lower walls 18 of the meter socket 40 terminate at a shorter length from the lowermost portion of the annular sidewall 14 than in the meter socket 10. Essentially, the lower walls 18 do not include a lower end portion which would include the aperture 20 and which would normally be used for mounting of a terminal block in a conventional meter socket.

Figure 6:
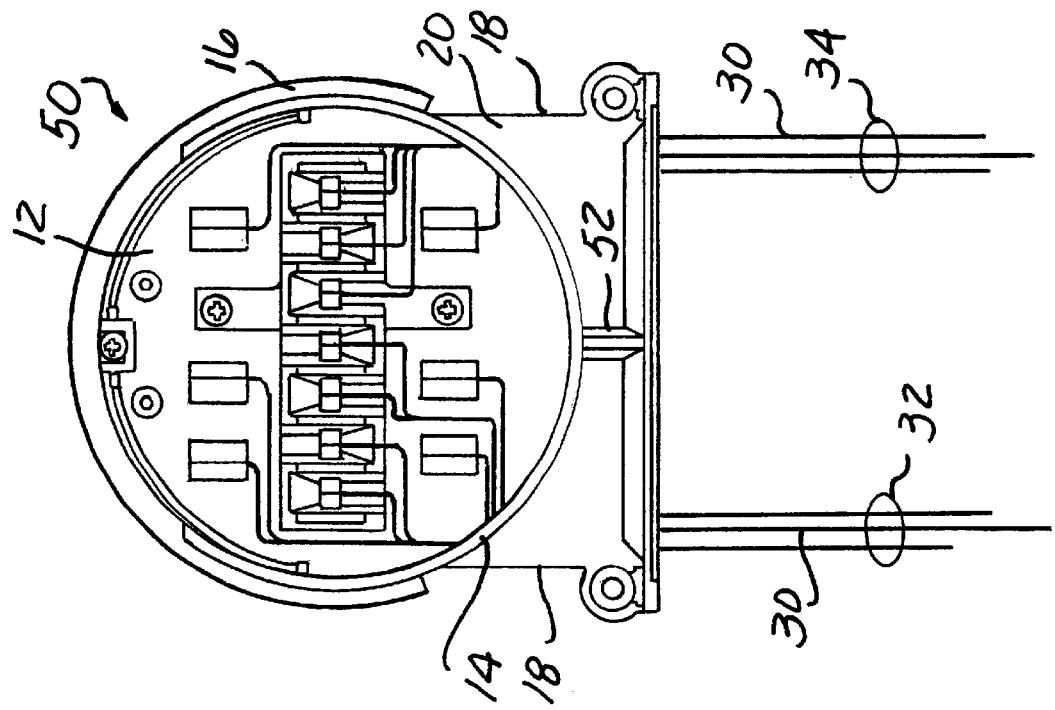
FIG. 6 is a front elevational view of yet another aspect of a meter socket according to the present invention.

FIG. 6 depicts yet another meter socket 50 which is essentially identical to the meter socket 40 shown in FIG. 5 and described above with one exception.

In this aspect of the invention, the meter socket 50 does not include any aperture corresponding to the aperture 36 in the filler 20 as in the meter sockets 10 and 40. In FIG. 6, the conventional rib 52 centered on the filler 20 extends between the annular sidewall 14 and a ridge or projection formed on a lower portion of the filler 20.

It will be understood that the meter socket 10, although described above as including the aperture 36 for receiving conductors extending from a watthour meter, may be formed without the aperture 36 in the same manner as shown in FIG. 6.

In use, any of the meter sockets 10, 40, or 50 are constructed in the manner described above with the conductors 30 extending individually or in multiple groups, such as two groups or bundles 32 and 34, from a lower open end of each meter socket 10, 40, or 50.

The meter socket 10, 40, or 50 is then mounted in a conventional socket enclosure by means of fasteners or hangers attachable to the base wall 12 of each meter socket and one wall, such as a back wall, of the socket enclosure.

A separate meter test switch is also mounted in the socket enclosure at a location spaced from the lower portion of the meter socket 10, 40, or 50. The individual conductors 30 are connected to the appropriate terminals on the meter test switch by means of the color coding format of the present invention.

Referring now to FIGS. 8–15, there is depicted another aspect of the present invention. In this embodiment, reference number 310 depicts a polyphase A to S watthour meter socket. Further details concerning the construction and use of the meter socket 310, not described herein, can be had by referring to U.S. Pat. No. 5,577,933, the contents of which are incorporated herein by reference.

The meter socket 310 is formed of a two-part housing including a rear housing 312 and a front housing 314. As shown in FIGS. 8, 9, 12 and 13, the rear housing 312 is formed with a planar base 316. An annular side wall 318 is integrally formed with and extends substantially perpendicularly from the base 316. The annular side wall 318 terminates in an angular discontinuity formed by side ends 320 and 322. Flanges 324 and 326 extend outward from the side ends 320 and 322, respectively, and are spaced therefrom to form mounting grooves for a rim filler described hereafter.

An annular rim 319 is formed at an outer edge of the annular side wall 318. Lower side walls 328 and 330 depend angularly from the side ends 320 and 322 of the side wall 318 to a bottom edge of the rear housing 312. A pair of hollow cylindrical members 332 are mounted integral with the lower side walls 328 and 330 to aid in aligning the front housing 314 to the rear housing 312.

In addition, a pair of spaced generally cylindrical members 334 and 336 of differing diameters are formed on the inside of each of the lower side walls 328 and 330 and form alignment, support and interlock surfaces for the front housing 314 as described hereafter.

Figure 8:
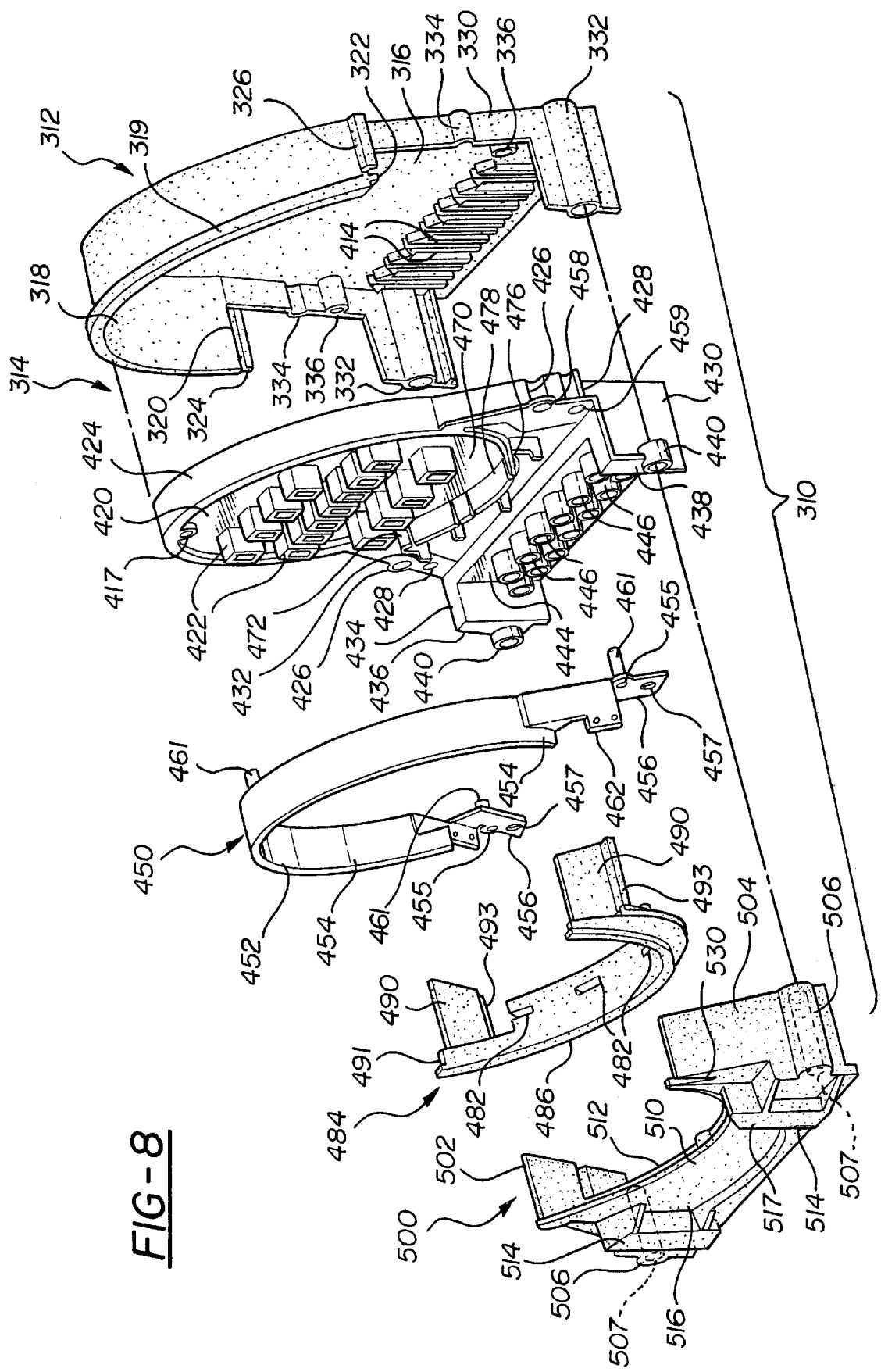
FIG. 8 is an exploded perspective view of another aspect of a watthour meter socket according to the present invention.
Figure 9:
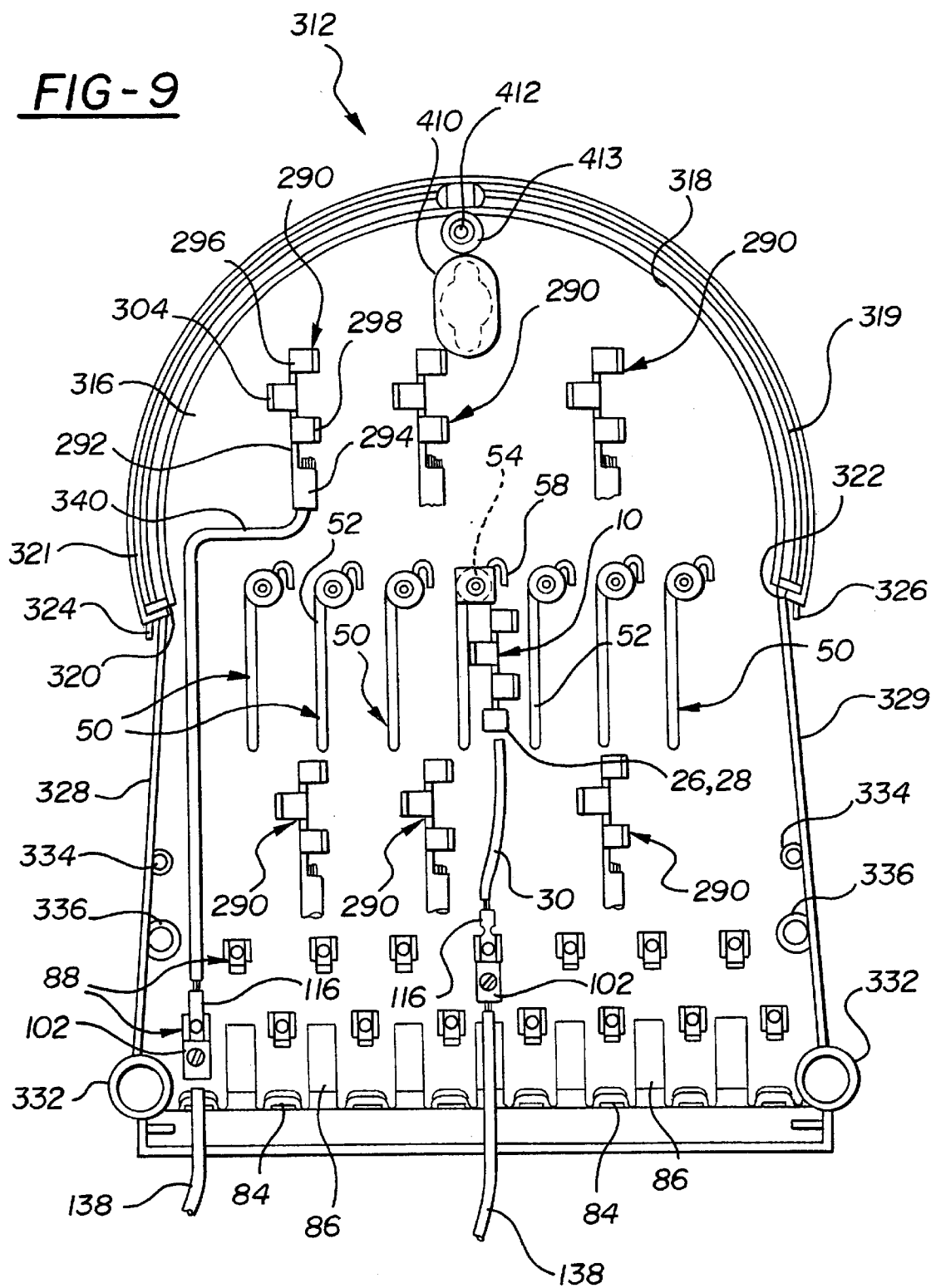
FIG. 9 is a front elevational view of the rear housing of the meter socket shown in FIG. 8, which also illustrates the electrical conductors and contacts mounted therein.

A plurality of spaced divider members all denoted generally by reference number 339 in FIGS. 8 and 9 are formed on the base 316 of the rear housing 312 and receive individual electrical conductors therebetween. The divider members 339 electrically insulate adjacent electrical conductors from each other. Although the dividers 339 are depicted as being formed completely on the base 316 of the rear housing 312, it will be understood that the dividers 339 may take other forms, such as being integrally formed on a rear surface of the front housing 314 or as complimentary, mating members individually formed on both of the front and rear housings 312 and 314.

Figure 12:
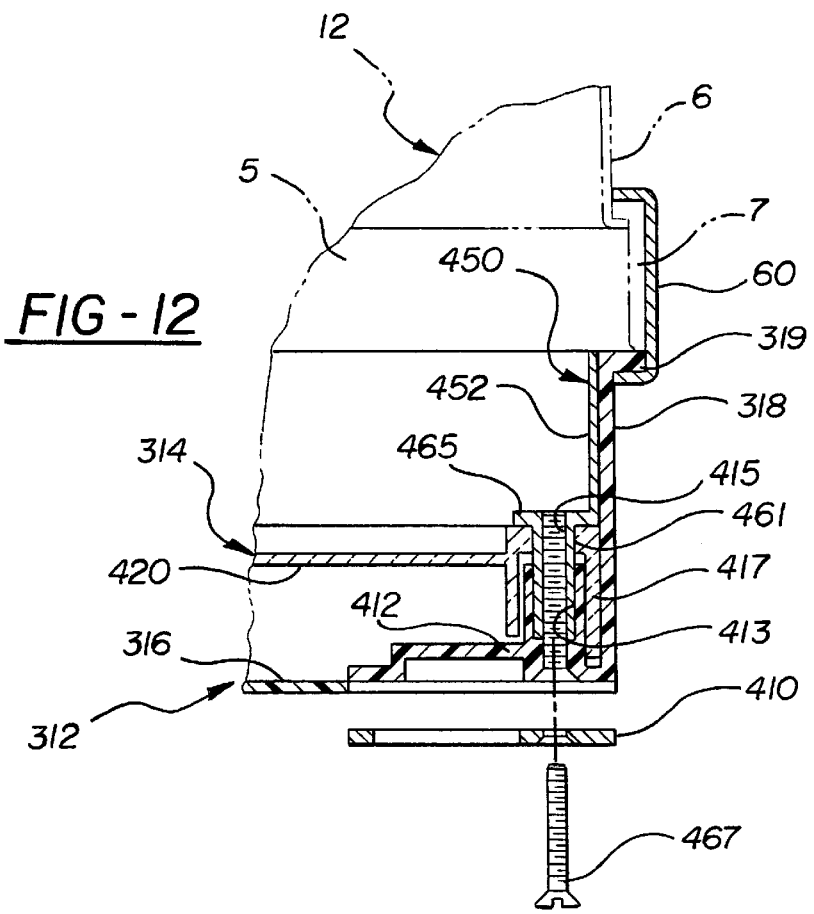
FIG. 12 is a cross-sectional view generally taken along line 12—12 in FIG. 10.

A metal hanger 410, shown in FIG. 12, is mounted on a rear surface of the base 316 for mounting the socket adapter 310 to a support surface in a conventional manner. A boss 412 with an internal bore 413 is formed on the base 316 for receiving a fastener 467 to attach the hanger 410 to the base 316 of the rear housing 312 as described hereafter.

As shown in FIGS. 8, 10, 12 and 13, the front housing 314 is formed as a one-piece, integrally molded member of an electrically insulating material, such as a suitable plastic. The front housing 314 can be formed of a transparent plastic to enable the location and connections of the conductors disposed behind the front housing 314 to be easily viewed. The front housing 314 includes a generally circular shaped, planar base 420. A plurality of hollow pockets or receptacles 422 are integrally formed on and extend outward from one surface of the base 420. Each receptacle 422 is designed to receive a contact attached to an electrical conductor in and includes a slot for slidably receiving a blade terminal of a watthour meter or other electrical apparatus inserted into the socket adapter 310.

An annular rim 424 extends from the base 420 of the front housing 314 and is engagable with the sidewall 318 and the flanges 324 and 326 formed at the ends 320 and 322, respectively, of the side wall 318 of the rear housing 312. In this position, the rim 424 overlays a portion of the lower side walls 328 and 330 of the rear housing 312. A pair of arcuate, generally cylindrical recesses 426 and 428 are formed in planar end portions of the rim 424 and are sized to matingly surround the cylindrical members 334 and 336 on the rear housing 312 to fixedly support and locate the front housing 314 relative to the rear housing 312. A lower side wall 430 extends from the lowermost recess 428 on each side of the first housing 314 to a bottom edge of the front housing 314.

A front cover filler 432 extends below the base 420 of the front housing 314 to the wire guide portion 434. The wire guide portion 434 extends outward from the front cover filler 432 and terminates in a pair of raised side walls 436 and 438 on opposite sides of the lower portion of the front housing 314. A pair of annular support members 440 are mounted in the side walls 436 and 438 and are alignable with the cylindrical bosses 332 in the rear housing 312 so as to receive mating locating pins 507 on a cover 500 as described hereafter.

A plurality of cylindrical, hollow tubular members 446 are carried in two staggered rows on a base 444 and open to the interior of the meter socket 310 between the front and rear housings 314 and 312, as also described hereafter.

A surge ground conductor 450, shown in FIGS. 8 and 10–13, is mountable over the base 420 of the front housing 314 and is disposed within the annular side wall 318 of the rear housing 312 after the front housing 314 has been joined to the rear housing 312. The surge ground conductor 450 is in the form of an annular ring 452 which terminates at opposed ends in a pair of fingers 454. Also, a pair of depending flanges 456 extend from the opposite ends of the annular ring 452 and include apertures 455 and 457 which are alignable with apertures 458 and 459, respectively, on the front cover filler 432.

A tapped or internally threaded generally cylindrical sleeve 461 in integrally formed on each end flange 456 of the ring 452 and extends perpendicularly outward from a rear surface thereof In addition, a depending apertured flange 465 is centrally formed at an upper portion of the annular ring 452 and has a similar threaded sleeve 461 extending therefrom as shown in FIGS. 6, 7 and 8 which is alignable with a bore 415 in a boss 417 in the top upper portion of the base 420 of the front housing 314 and the bore 413 in the boss 412 in the rear housing portion 312.

As shown in FIG. 12, the hanger 410 is mounted in a recess formed in the base 316 of the rear housing 312. An aperture in the hanger 410 is alignable with a bore 413 in the boss 412 formed on the base 316. The boss 417 depending from the top central portion of the base 420 of the front housing 314 fits over the boss 412 on the base 316 of the rear housing 312 and receives the sleeve 461 mounted at the top central portion of the annular ring 452. A fastener 467 is inserted through the aperture in the hanger 410 and through the rear of the base 316 and the bore 413 in the boss 412 into threaded engagement with the sleeve 461 on the surge ground conductor 450 to secure the surge ground conductor 450 to the front housing 314 as well as to assist in securing the front housing 314 to the rear housing 312.

Figure 13:
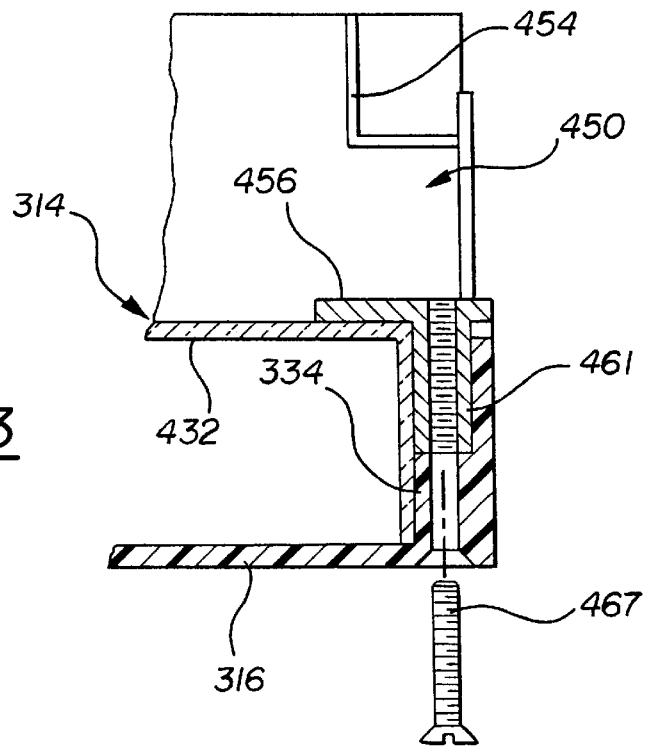
FIG. 13 is a cross-sectional view generally taken along line 13—13 in FIG. 10.

Similarly, as shown in FIG. 13, the tubular sleeves 461 on each of the flanges 456 on the surge ground conductor 450 are insertable through the apertures 458 formed on the front housing 314. The internal threaded bore in the sleeve 461 is alignable with a corresponding bore formed in the cylindrical members 334 formed on the base 316 of the rear housing 312. A metallic fastener 467 is inserted through the rear of the base 316 into threaded engagement with the sleeve 461 to secure the end flanges 456 of the surge ground conductor 450 to the front housing 314 as well as to secure the front housing 314 to the rear housing 312.

Another fastener, not shown, is extendable through each lower aperture 457 in each mounting flange 456 on the annular ring 452 and an aperture 459 in the front housing 314 and through the cylindrical member 336 in the rear housing 312 to provide a means for mounting the socket adapter 310 to a wall or other support surface which may or may not be metallic ground.

As also shown in FIGS. 8, 11, 14 and 15, an outwardly extending flange 462 is formed on one depending flanges 456 of the surge ground conductor 450 and includes a slot 464 and an aperture 469.

Figure 10:
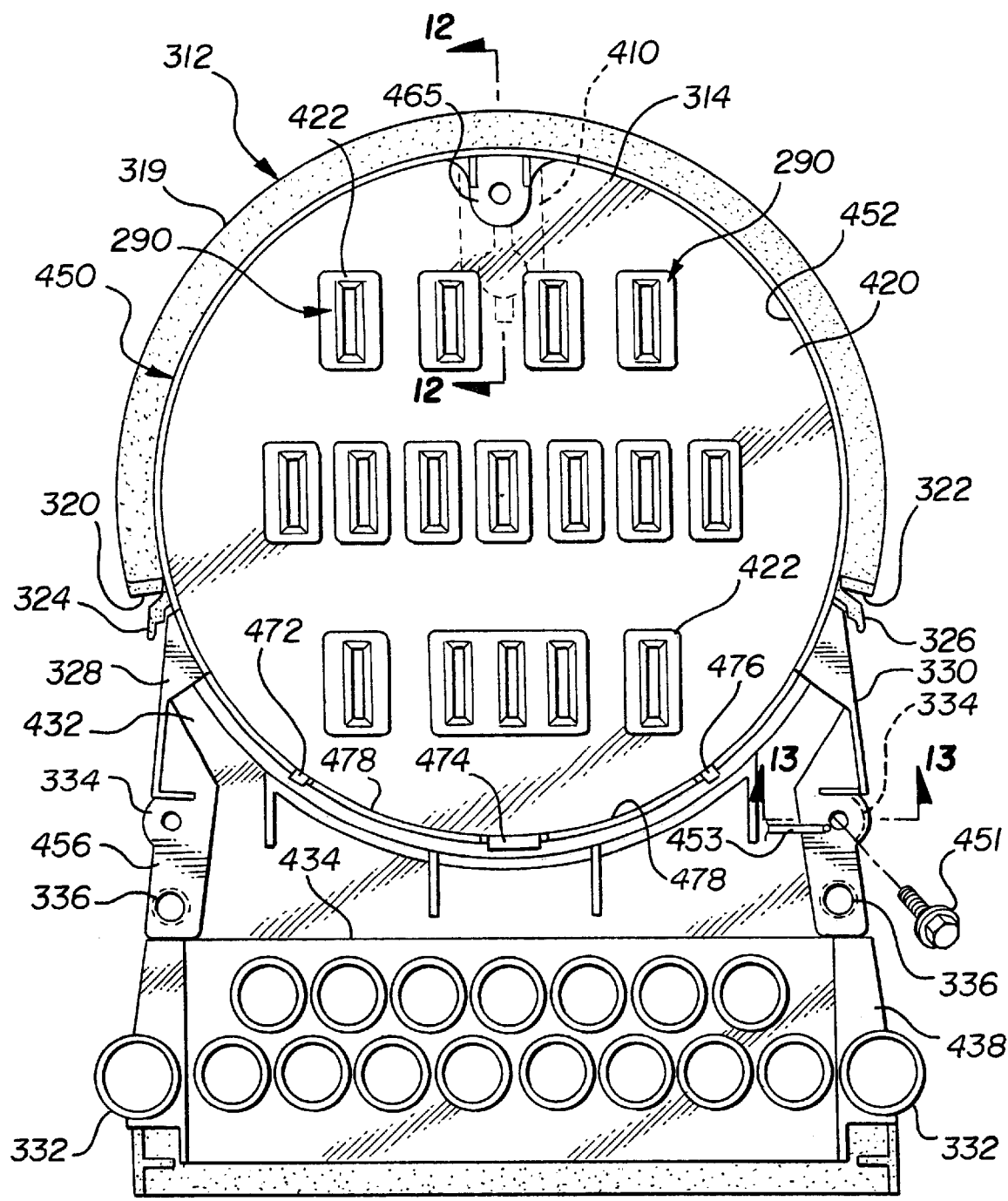
FIG. 10 is a front elevational view of the assembled meter socket shown in FIG. 8.
Figure 11:
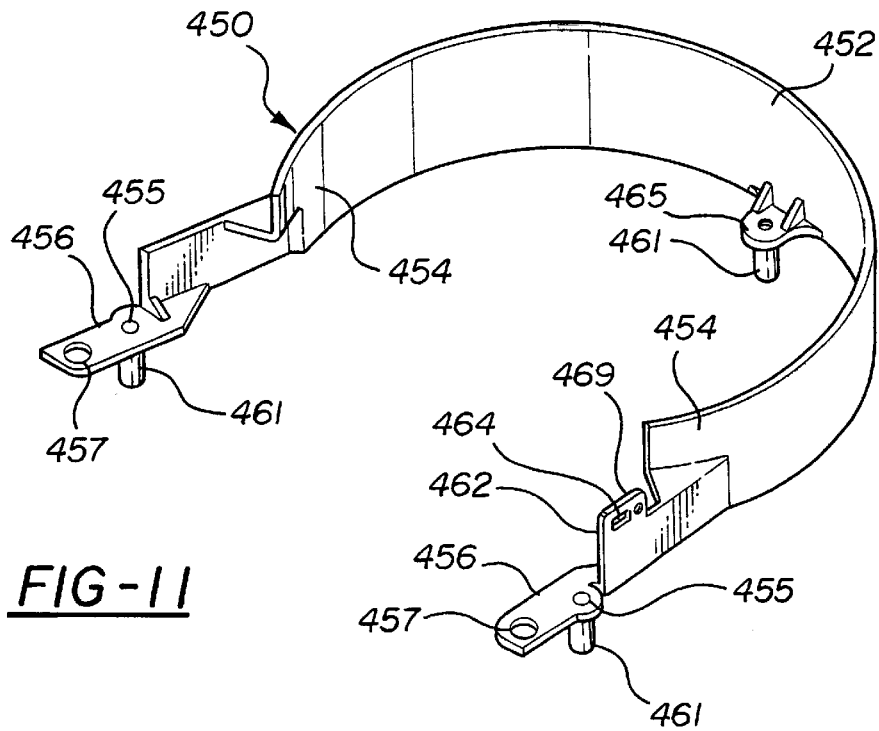
FIG. 11 is an enlarged, perspective view of the surge ground ring employed in the meter socket shown in FIGS. 8 and 9.
Figure 14:
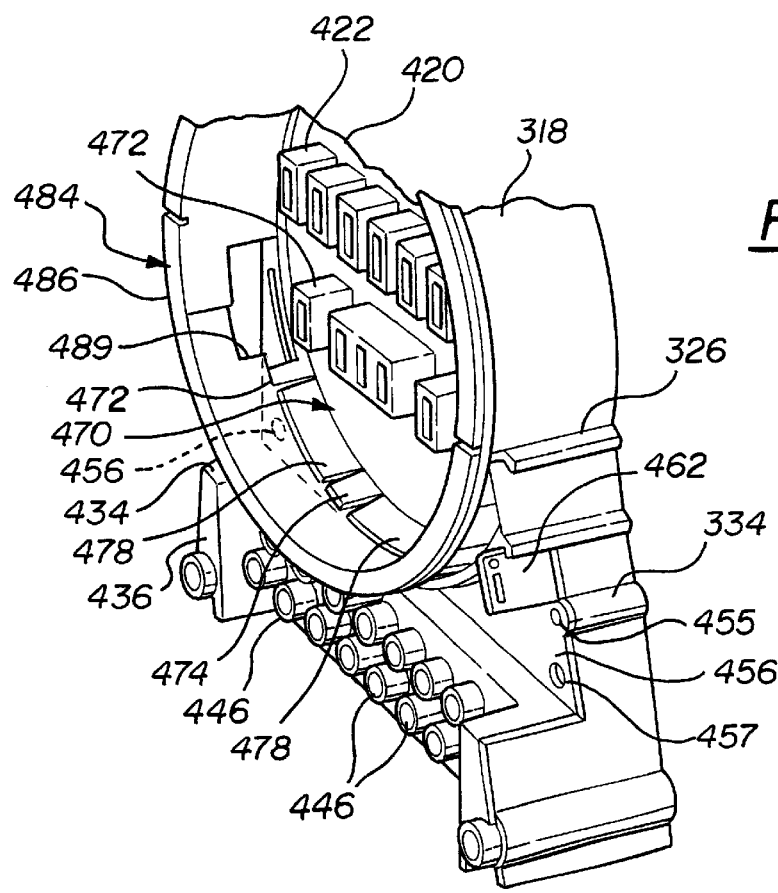
FIG. 14 is a partial, perspective view of a lower portion of the meter socket adapter shown in FIG. 8.

As shown in FIG. 8, and in greater detail in FIGS. 10 and 14, a rim filler denoted generally by reference number 470 is formed on the base 420 of the front housing 314 and is positioned to fill the angular discontinuity between the side edges 320 and 322 of the annular side wall 318 of the rear housing 312 when the front housing 314 is mounted in the rear housing 312. The rim filler 470 extends substantially perpendicularly from a lower portion of the base 420 and includes a plurality of angularly spaced tabs 472, 474, and 476 which are angularly spaced apart by annular flanges 478.

Pointed flanges are formed on ends of the rim filler tabs 472, 474, and 476 to interlockingly mate with corresponding slots 482 formed on a rim filler extension 484. As shown in FIGS. 8 and 14, the rim filler extension 484 includes an arcuate portion 486 sized to mount below the rim filler 470. The plurality of slots 482 formed in the arcuate portion 486 interlockingly engage the tabs 472, 474 and 476 when the rim filler extension 484 is mounted on the rim filler 470. A pair of mounting arms 490 extend outward from opposite ends of the arcuate portion 486 and interlock with the flanges 324 and 326 of the rear housing 312 to align the rim filler extension 484 with the rear housing 312. The ends of the mounting arms 490 are formed with a narrow projection 493 which extends outward from each outer end of the mounting arms 490. Each projection 493 slidably engages a mating slot formed in each side end 320 and 322 of the annular side wall 318 of the rear housing portion 312.

Slots 489 formed between the rim filler 470 and the rim filler extension 484 are disposed adjacent to the base 420 of the front housing portion 314 and provide openings through which auxiliary wires connected to electronic circuits in a watthour meter mounted in the meter socket 310 or from current terminals or other terminals mounted in the meter socket 310 pass from the front housing 314 to the wire guide portion, and from the wire guide portion, as described hereafter, externally from the meter socket 310.

Figure 15:
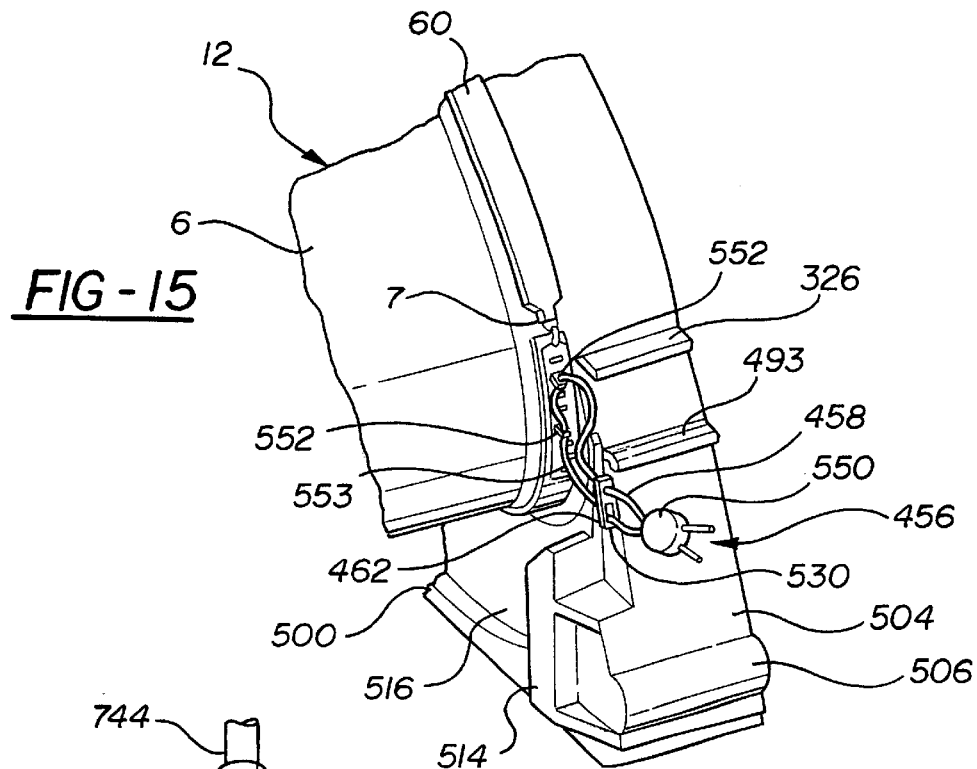
FIG. 15 is a partial, perspective view of a lower portion of the meter socket shown in FIG. 9, with the terminal cover, watthour meter, sealing ring and wire seal depicted in their respective assembled, mounting positions.

A lower cover denoted generally by reference number 500 in FIGS. 8 and 15 is mountable over the wire guide portion 444 of the front housing 314. The cover 500 includes a front wall 516 and a pair of side walls 502 and 504. The side walls 502 and 504 slide over the lower side walls 328 and 330 of the rear housing 312. A cylindrical boss 506 is formed in each side wall 502 and 504 for surrounding alignment with one of the tubular members 332 formed in the side walls 328 and 330 of the rear housing 312. A pin 507 is mounted internally and concentrically within each boss 506. The pins 507 are typically hollow tubular members which taper toward the rear edge of the terminal cover 500. The pins 507 extend through the annular support members 440 and the cylindrical members 332 when the cover 500 is mounted on the front housing 314 and are perpendicular to the surface of the front housing 314 to restrict partial removal of the cover 500 from the front housing 314.

An arcuate edge 510 formed on the front wall 516 extends between the side walls 502 and 504 and has an inward extending flange 512 extending therefrom. The edge 510 engages a shoulder in the rim filler extension 484.

A pair of raised channel sections 514 are integrally formed on the cover 500 and extend outward from the front wall 516 of the terminal cover 500. Channel portions 514 are hollow and form an interior cavity 517 which opens to a cavity between the front wall 516 and the front cover filler 432 for the passage of the auxiliary wires the cover 500 in front of the front housing 314.

In addition, a slot 530 is formed along one edge of the cover 500 adjacent to the side wall 504 and is alignable with the outwardly extending flange 462 on the surge ground conductor 450.

As shown in FIG. 15, the sealing ring 60 is mounted about the mounting flange 319 and the metal cover ring 7 of the watthour meter 12. The sealing ring 60 is of conventional construction and includes spaced ends which are brought into engagement when the sealing ring 60 is mounted on the mating mounting flanges. At least one and preferably two flanges 552 extending outward from one end of the sealing ring 60 pass through a slot 553 in the other end of the sealing ring 60. At least one aperture is formed in the flange 552. Due to the close proximity of the flange 462 on the surge ground conductor 450 with the flange 552 on the sealing ring 60, a conventional seal 456, such as a lead wire seal, may be used to sealingly connect the flange 462 and the flange 552 on the sealing ring 60 to provide an indication of any tampering or unauthorized removal of the sealing ring 60 from the adapter. A wire 458 is passed through the slot 464 in the flange 462 on the surge ground conductor 450 and the aperture in the flange 552 on the sealing ring 60 before the ends of the wire 458 are lockingly crimped into the lead slug 550.

The above described structure provides a ground path which electrically connects sealing ring 60, the meter cover ring 7, and the seal 456 to a ground in the meter socket 310. The ground connection extends from the watthour meter cover ring 7 through the sealing ring 60 which is connected thereto, by the wire seal 456, the flange 462 on the surge ground conductor 450, and the fasteners 467, one of which is shown in FIG. 13, connecting the surge ground conductor 450 to the hanger 410. When the meter adapter is mounted on a wall or support surface, the hanger 410 may engage a metal wall to provide a ground connection to the surge ground ring 450. Alternately, as shown in FIG. 10, a ground screw 451 may be threadingly engaged through an upper portion of one of the sleeves 461 extending from an end flange 456 on the surge ground conductor 450 to secure a ground wire 453 which can pass through the channels formed by the raised portions 514 of the terminal cover 500 externally of the meter socket 310 to an external ground connection, such as a ground rod.

To complete the meter socket 310, a plurality of electrical conductors, all generally depicted by reference number 340 in FIG. 9, are disposed in the meter socket 310, between the base 420 of the front housing 314 and the base 316 of the rear housing 312. The conductors 340 are flexible wires Line and load contacts 290 are arranged in the meter socket 310 in the conventional watthour meter adapter or meter socket positions. As shown in FIG. 9, the topmost row of contacts 290 are in contact positions 1, 9 and 3, starting from the left side in the orientation shown in FIG. 9. Contact position 8 between contact positions 9 and 3 is empty in this exemplary embodiment. The second or lower row of contacts 290 are mounted in positions 2, 10, 7 and 4, again starting from the left side of the socket 310. The conductors 340 are connected to one end to the various contacts 290.

Any type of current contact 290 may be employed in the present meter socket 310, including the current contact shown in FIGS. 30, 31, and 39 of U.S. Pat. No. 5,577,993. The subject matter of this referenced application, with respect to the current contacts 290, is incorporated herein by reference.

As shown in FIG. 9, each current contact 290 comprises a planar end 292 from which extends a wire crimp collar 294. The collar 294 receives the end of a current conductor 340. A plurality of jaws extend from the end portion 292. A first jaw is formed of spaced legs 296 and 298 which have the same angularly bent shape and terminate in end portions 300 and 302, respectively, which are disposed at an approximate 15° angle with respect to the main extent of each leg 296 and 298 and which extend outward in a first direction from the plane in which the end portion 292 lays. The legs 296 and 298 are spaced apart and have an intermediate leg or second jaw 304 interposed therebetween. The leg 304 is formed with a curved position 305 extending from the planar end 292 and a planar, angularly disposed outer end portion 306 which extends outward in an opposite direction with respect to the plane of the end portion 292 from the end portions 300 and 302 of the legs 296 and 298. The legs 296, 298 and 304 combine to form a jaw contact for receiving an external lead or terminal.

The intermediate leg 304 may be formed to be more flexible than the legs 296 and 298. This is preferably achieved by forming the leg 304 of a smaller width than the width of the legs 296 and 298. In addition, the end portion 306 of the leg 304 is preferably disposed at an approximate 15° angle from the plane of the planar end portion 292. A curved portion extends from an end of the portion 306 at an angle of greater than 15° from the plane of the end portion 292. This provides a low blade terminal insertion force and a higher pull out force.

The juncture between the portions 305 and 306 on the intermediate leg 304 acts as a detent when it engages a center aperture in a blade terminal inserted into the current contact 290. The resiliency of the leg 304 enables the leg 304 to flex or bend sufficiently to receive or allow the withdrawal of the blade terminal, while lockingly retaining the blade terminal therein.

Figure 16:
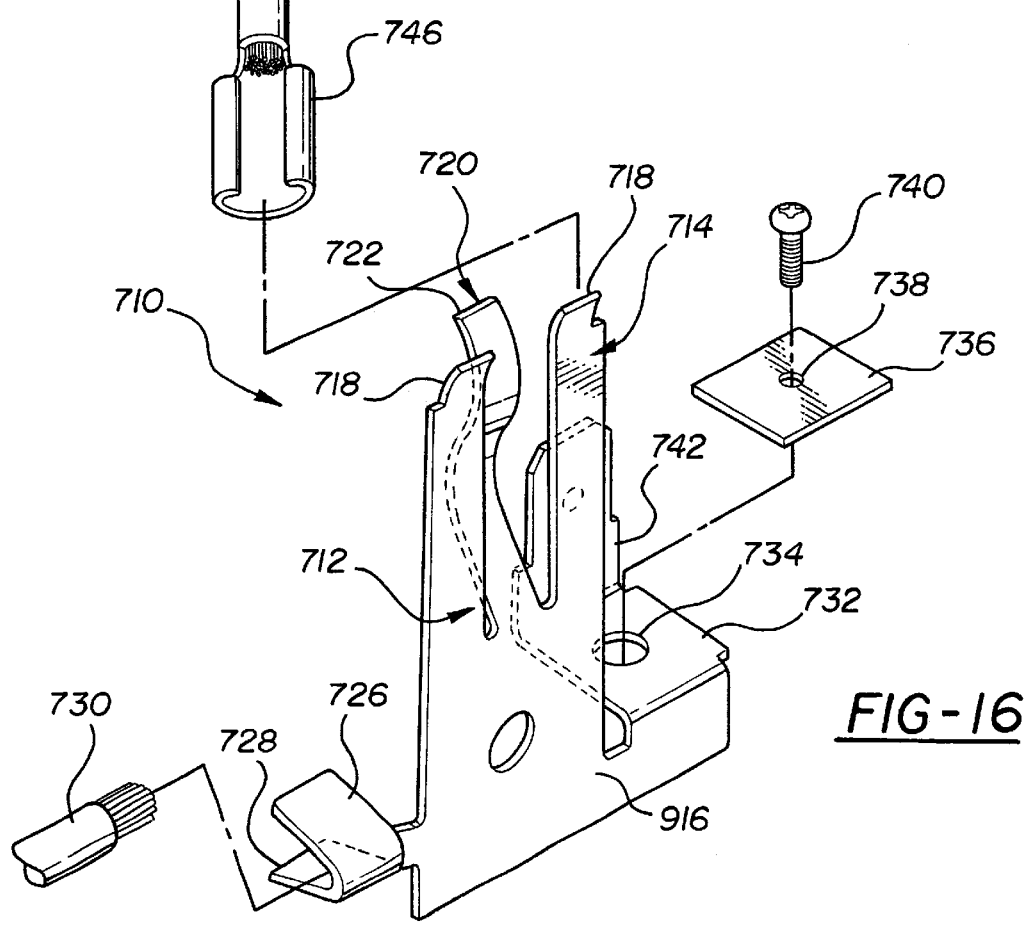
FIG. 16 is an exploded, perspective view of a potential jaw contact usable in the meter socket of the present invention.
Figure 17:
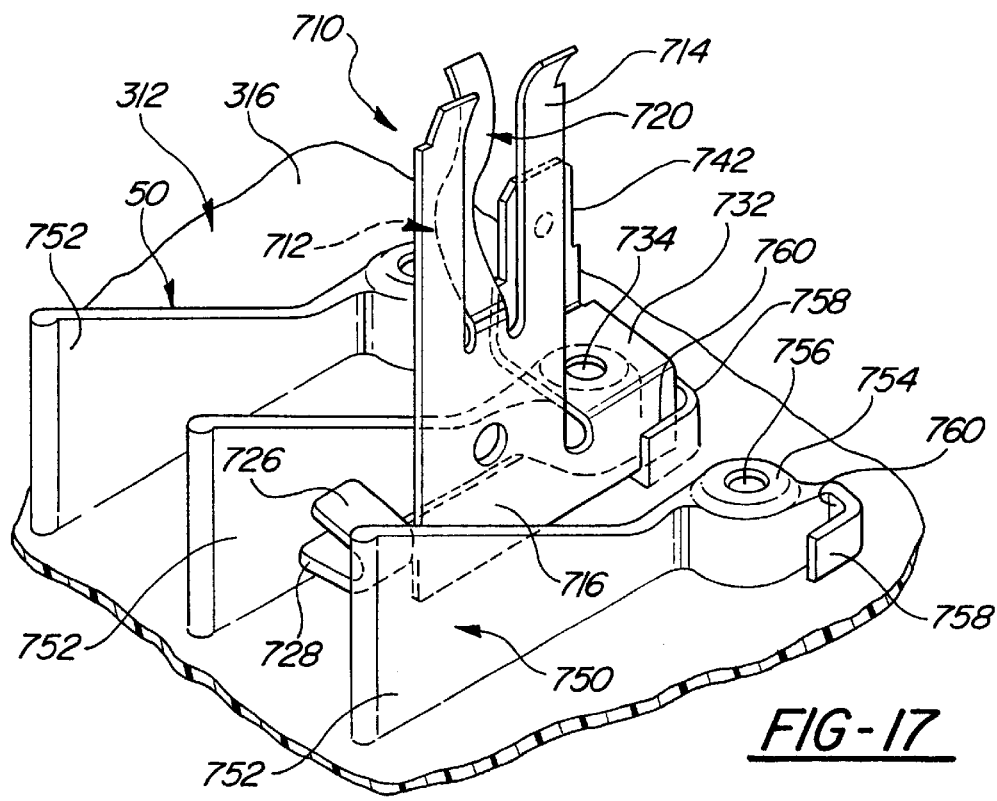
FIG. 17 is a partial, enlarged, perspective view of a potential jaw contact mount for the jaw contact shown in FIG. 16.
Figure 18:
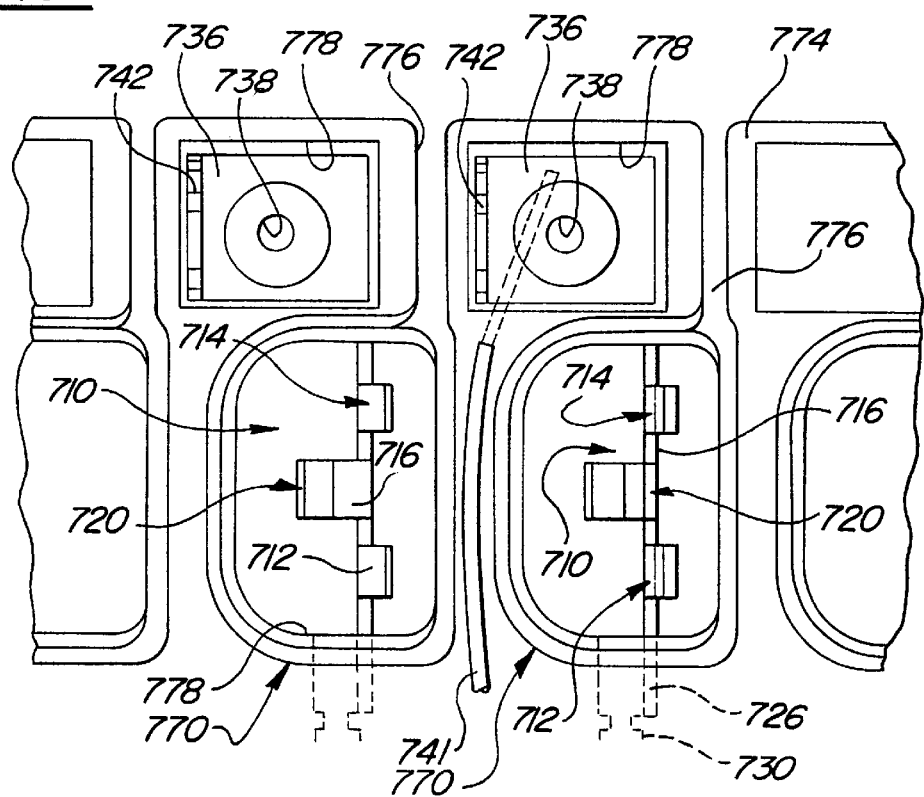
FIG. 18 is a partial, enlarged, front elevational view of the potential terminal receptacles on the front housing portion of the meter socket shown in FIG. 8.

A plurality of potential jaw contacts, each denoted by reference number 10 as shown in FIGS. 16–18, are disposed in the meter socket 310 and held in position between the front and rear housings 314 and 312 as described hereafter. As each of the potential jaw contacts 710 is identically constructed, only one potential jaw contact 10 will be described hereafter.

As shown in FIGS. 16–18, each potential jaw contact 710 is similar to the current contact 290 described above in that it includes a three finger jaw contact design formed of first and second outer legs 712 and 714 which have a generally linear extent from a base 716. Each of the legs 712 and 714 terminates in an angularly bent or extending end portion 718, both of which extend in the same direction to one side of the base 716. An intermediate leg 720 is disposed between the outer legs 712 and 714 and has a generally sinusoidal shape extending from the base 716 to an opposite side of the base 716 from the outer ends 718 of the outer legs 712 and 714. The outer end 722 of the intermediate leg 720 curves outward to one side of the base 716 opposite from the direction of the outward extent of ends 718 of the legs 712 and 714 to form a jaw contact which receives a potential blade terminal extending outward from the base of a watthour meter, not shown.

Figure 19:
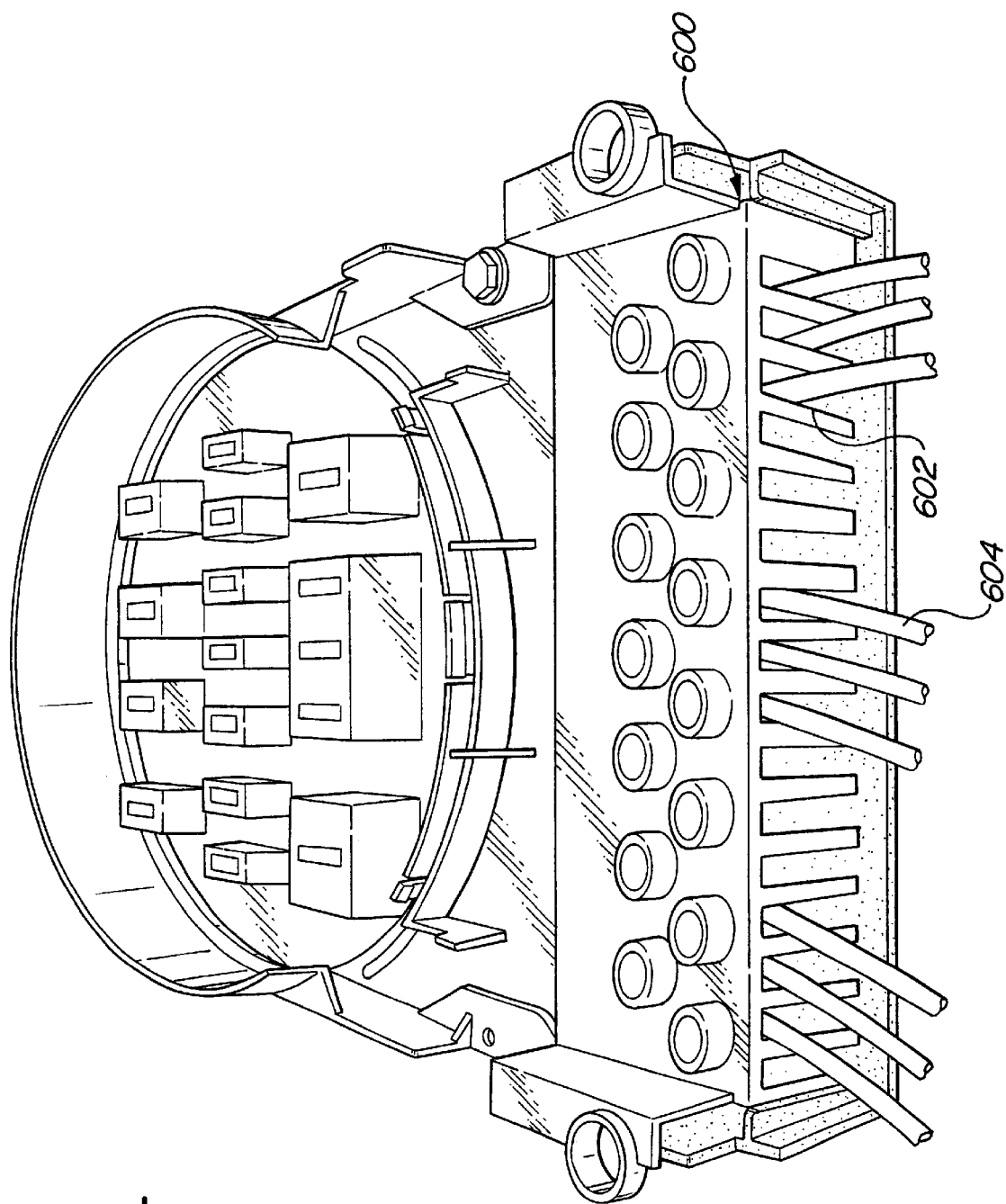
FIG. 19 is a bottom perspective view of the assembled meter socket shown in FIG. 8.

A wire crimp collar is formed of two angularly disposed, bendable flanges 726 and 728 extending from one end of the base 716. The flanges 726 and 728 are bendable in registry with one end of an external conductor 604 as shown in FIG. 19 to electrically connect one end of conductor 604 to one potential jaw contact 710. Alternately, solder may be used to connect the conductor 604 to the flanges 726 and 728.

As shown in FIGS. 17 and 18, a support flange 730 is formed contiguous with the base 716, and is bent angularly from the base 716 to extend generally perpendicularly from one end of the base 716. A threaded aperture 734 is formed in the support flange 732. A screw fastener 740, with or without a washer 736, threadingly engages the aperture 734 on the support tab 732. An external conductor 604, shown in FIGS. 16, 18 and 19, can be fixedly disposed between the fastener 40 and the support flange 32 to thereby connect the conductor 604 to the potential jaw contact 710.

A mounting post or tab 742 extends perpendicularly from an outer end of the support flange 732. The mounting post 742 provides a separate connection to another external electrical conductor shown by reference number 744. In this connection, an electrical connector 746, such as a conventional fast-on or quick connector, is fixedly attached to one end of the external conductor 744 and is slidably engagable over complementary formed mounting post 742 to connect the external conductor 744 to the potential jaw contact 710.

Referring briefly to FIG. 18, it can be seen that sufficient space exists between the aperture 738 in the contact plate 736 which receives the screw fastener 740 and the mounting post 742 to enable another external conductor 741 to be inserted between the screw 740, the aperture 738 and the mounting post 742 and connected to the potential jaw contact 710.

It will be understood that a support flange 730 and screw fastener 740 and/or the mounting post 742 may also be formed on the current contacts 290 to enable an external conductor to also be connected to any of the current contacts 290.

A plurality of mounts 750, shown in FIG. 17, are provided on the rear housing 312 for supporting each potential jaw contact 710 in the rear housing 312 to eliminate the need for separate screw-type fasteners for each contact as in previously devised in watthour meter socket adapters.

Each mount 750 is identically constructed and includes an elongated wall 752 having a generally planar shape. Each wall divider 752 extends from a cylindrical boss 754 having a central bore 756 therein. Bore 756 is designed to receive the end of the screw fastener 740 extending through the contact plate 738. A generally U-shaped, arcuate tab 758 extends from the cylindrical boss 754. The tab 758 forms an open ended slot 760 next to the boss 754 which has a width designed to releasably but snugly receive one end of the base 716 of one potential jaw contact 10 as shown in FIG. 17. When the end of the base 716 of one potential jaw contact 710 is mounted in the slot 760, the support flange 732 on the contact 10 will overlie and rest on the upper end of the cylindrical boss 754, with the aperture 734 in the tab 732 aligned with the bore 756 in the cylindrical boss 754. The base 716 extends along and is spaced from the wall 752 to provide ample room between spaced walls 752 for insertion of external conductors into the flanges 726 and 728 at one end of the base 716. It should be noted that this potential jaw contact mount 50 securely mounts the potential jaw contact 710 on the base 316 of the rear housing 312 without the need for any separate fasteners, thereby significantly reducing labor and assembly time of the watthour meter socket adapter.

A plurality of dividers 600 depend from the base 444 and are spaced apart to form a plurality of channels 602. The channels 602 are formed between adjacent dividers. When the top plate or housing 314 is mounted on the rear plate or housing 312, the dividers 602 in conjunction with a portion of the rear housing 312 and the top plate 314 cooperate to form a through bore extending through each channel 602 which is sized to receive at least one flexible electrical conductor therethrough.

Although any conductor 340 could be passed through any of the channels 602, it is preferred that a conductor 340 connected to one particular jaw contact be passed through the channel 602 which would normally receive a terminal for connection to the end of the conductor 340. Thus, the conductor connected to one jaw contact 340 will pass through the channel which normally receives the terminal to which the conductor is attached in a conventional meter socket adapter. As the jaw and terminal locations are well known in the industry, the position of the conductor 340 exiting each channel 602 will be readily known to a utility service person for connection to the external device, such as a meter test switch assembly.

The same applies for the potential jaw contacts mounted in the housing. Conductors 604, each connected to one of the potential jaw contacts, are routed through the interior of the housing and pass through one of the channels 602, generally in a channel intermediate the outer channels normally employed for the line and load power conductors 340.

The known exit location of each conductor from the housing coupled with the ability to color code each conductor 340 and 604 enables a utility service person to more easily and quickly and, hence, with less labor and assembly time, connect the individual conductors 340 and 604 to the particular meter test switch terminals. As a back up, the transparent construction of the upper plate of the housing enables a utility service person trace the route of each conductor 340 or 604 through the housing to it's connection on to a jaw contact.

It will also be understood that the upper plate 314 of the housing 310 and the jaw contact cover can be replaced by a simple cover having the dividers 600 formed therein. The meter receiving portion would still contain the jaw contacts which are positioned to receive the blade terminals of a watthour meter. Each conductor which is connected at one end to each jaw contact, can be routed through the appropriate wire guides in the bottom end of the housing 310 formed by the dividers 600 carried by the wire guide base 444.

The provision of a meter socket having conductors of an extended length connected at one to the jaw contacts in the meter socket and extending outward from an open end of the meter socket for connection to a remotely located meter test switch simplifies the mounting and use of new and/or existing meter test switches with the inventive meter socket. The conductors passing out of the meter socket are color coded for connection to appropriate meter test switch terminals thereby simplifying the interconnection of the meter socket and the meter test switch. The unique provision of an aperture in the filler portion of the meter socket facilitates the passage of auxiliary cables or conductors from a watthour meter mounted on the meter socket through the interior of the meter socket for connection to an external device or circuit.

The provision of wire guide or channels at the end of the housing, in one aspect of the invention, further simplifies the interconnection of the meter socket and the meter test switch since the conductors connected to the power and potential jaw contacts are routed through the wire guides at the normal positions in a meter socket adapter where such conductors are connected to terminals which also receive the meter test switch conductors would be connected to such terminals.

The provision of a meter socket having conductors of an extended length connected at one to the jaws in the meter socket and extending outward from an open end of the meter socket for connection to a remotely located meter test switch amplifies the mounting and use of new and/or existing meter test switches with the inventive meter socket. The conductors passing out of the meter socket are color coded for connection to appropriate meter test switch terminals thereby simplifying the interconnection of the meter socket and the meter test switch.

What is claimed is:

1. A watthour meter socket for connection to a watthour meter test switch, the meter socket comprising:
   a housing having a base and a sidewall extending from the base, the sidewall having a mounting flange at one end of at least a portion of the sidewall for interconnection with a mating mounting flange on a watthour meter,
   a wire guide portion formed on the base, wire guides formed in the wire guide portion adjacent to the base of the housing;
   jaw contacts mounted on the base of the housing for receiving blade terminals of a watthour meter; and
   flexible electrical conductors, each connected at one end to one of the jaw contacts and extending unitarily through the wire guides externally from the housing to another end, the another end of each conductor adapted to be directly connected to an electrical connection remotely located from the housing.

2. The meter socket of claim 1 wherein the conductors extending from the housing of the meter socket have unique exterior color coding to identify each specific conductor.

3. The meter socket of claim 1 further comprising:
   cover means, carried in the housing, for covering substantially all of the electrical conductors and the jaw contacts in the housing, the cover means including a plurality of apertures, one aperture disposed adjacent each jaw contact for receiving a blade terminal of a meter therethrough.

4. The meter socket adapter of claim 3 wherein the cover means comprises:
   a first plate, the sidewall extending between the first plate, the first plate and the base spaced apart to define a cavity therebetween, the electrical conductors and the jaw contacts disposed in the cavity and substantially enclosed by the first plate, the base and the annular sidewall.

5. The meter socket of claim 4 further comprising:
   the first plate carrying the dividers forming the wire guides.

6. The meter socket of claim 1 further comprising:
   a plurality of potential jaw contacts mounted in a meter receiving portion of the housing and adapted to receive potential terminals on a meter coupled to the housing; and
   an electrical conductor connected to each potential jaw contact at one end and having an intermediate portion extending through one wire guide to an opposite end external of the housing.

7. The meter socket of claim 6 wherein the conductors extending from the housing of the meter socket have unique exterior color coding to identify each specific conductor.

8. A watthour meter socket for connection to a watthour meter test switch, the meter socket comprising:
   a housing having a base and a sidewall extending from the base, the sidewall having a mounting flange at one end of at least a portion of the sidewall for interconnection with a mating mounting flange on a watthour meter;
   jaw contacts mounted on the base of the housing for receiving blade terminals of a watthour meter;
   a wire guide portion formed on the base, wire guides formed in the wire guide portion adjacent to the base of the housing; and
   flexible electrical conductors, each connected at one end to one of the jaw contacts and extending unitarily through the wire guides externally from the housing to another end, the another end of each conductor adapted to be directly connected to a remotely located meter test switch.

9. A watthour meter apparatus for electrically connecting to a watthour meter, the apparatus comprising:
   a watthour meter socket including:
      a housing having a base and a sidewall extending from the base, the sidewall having a mounting flange at one end of at least a portion of the sidewall for interconnection with a mating mounting flange on a watthour meter;
      jaw contacts mounted on the base of the housing for receiving blade terminals of a watthour meter;
      a wire guide portion formed on the base, wire guides formed in the wire guide portion adjacent to the base of the housing;
      flexible electrical conductors, each connected at a first end to one of the jaws and extending unitarily through wire guides externally from the housing to a second end;
      a plurality of instrument transformers, each having electrical leads extending therefrom; and
      means for connecting the second ends of the electrical conductors to the instrument transformers.

10. The watthour meter apparatus of claim 9 wherein the means for connecting the second ends of the electrical conductors to the instrument transformers comprises:
    a plurality of meter test switches, each test switch having terminals for receiving the second end of one of the electrical conductors and one electrical lead on one instrument transformer.

11. The watthour meter apparatus of claim 9 wherein the means for connecting the another ends of the electrical conductors to the instrument transformers comprises:
    the second ends of the conductors connected directly to the instrument transformers.

* * * * *